(12) United States Patent
Harald

(10) Patent No.: US 7,639,066 B2
(45) Date of Patent: Dec. 29, 2009

(54) CIRCUIT AND METHOD FOR SUPPRESSING GATE INDUCED DRAIN LEAKAGE

(75) Inventor: Streif Harald, Davis, CA (US)

(73) Assignee: Qimonda North America Corp., Cary, NC (US)

( * ) Notice: Subject to any disclaimer, the term of this patent is extended or adjusted under 35 U.S.C. 154(b) by 203 days.

(21) Appl. No.: 11/611,222

(22) Filed: Dec. 15, 2006

(65) Prior Publication Data

US 2008/0142854 A1    Jun. 19, 2008

(51) Int. Cl.
*G05F 1/10* (2006.01)
(52) U.S. Cl. .................. 327/534; 327/112
(58) Field of Classification Search .......... 327/108, 327/111, 112, 534
See application file for complete search history.

(56) References Cited

U.S. PATENT DOCUMENTS

| | | | |
|---|---|---|---|
| 5,896,045 A * | 4/1999 | Siegel et al. | 326/81 |
| 6,054,888 A * | 4/2000 | Maley | 327/333 |
| 6,140,846 A * | 10/2000 | Chan et al. | 327/108 |
| 6,351,157 B1 * | 2/2002 | Sharpe-Geisler | 327/108 |
| 6,429,716 B1 * | 8/2002 | Drapkin et al. | 327/333 |
| 6,628,149 B2 * | 9/2003 | Ajit | 327/108 |
| 7,205,807 B2 * | 4/2007 | Svensson et al. | 327/170 |
| 7,224,195 B2 * | 5/2007 | Pilling et al. | 327/112 |

* cited by examiner

*Primary Examiner*—Jeffrey S Zweizig
(74) *Attorney, Agent, or Firm*—Edell, Shapiro & Finnan, LLC

(57) ABSTRACT

An electrical circuit comprising a first metal oxide silicon (MOS) n type field effect transistor (NFET) or p type field effect transistor (PFET) and a second MOS NFET or PFET of the same conductivity type as the first NFET or PFET, wherein the drain of the first NFET or PFET is directly connected to the source of the second NFET or PFET, and wherein the gate of the second NFET or PFET is at a voltage value which is equal to or lower than the drain voltage value of the second NFET or PFET in the case of an NFET and equal to or higher than the drain voltage value of the second NFET or PFET in the case of a PFET.

6 Claims, 5 Drawing Sheets

CIRCUIT AND METHOD FOR SUPPRESSING GATE INDUCED DRAIN LEAKAGE

FIELD OF THE INVENTION

The present invention is directed to a circuit and method for suppressing gate induced drain leakage (GIDL) in field effect transistors (FETs).

BACKGROUND OF THE INVENTION

Field effect transistors are widely used in electronic circuitry. It is desirable to keep leakage currents in such devices as low as possible or eliminate them altogether, since such currents waste power. One leakage mechanism which results in a relatively small amount of leakage in metal oxide silicon (MOS) type field effect transistors (MOSFETs) is known as gate induced drain leakage (GIDL). In the prior art, because of the small amount of leakage involved, it typically was not necessary to provide additional circuitry for suppressing GIDL.

However, with the progression of the development of integrated circuit technology, GIDL has become of more concern. Thus, as devices with smaller and smaller feature sizes are developed, the ratio of leakage to operating current increases. At the same time, the trend into mobile applications requires a minimum power loss to support long battery life.

GIDL is caused by a relatively high gate to drain voltage difference generating electron-hole pairs in the overlap region of the gate and the drain. A similar effect may occur at the overlap region of the gate and source, but the gate to source voltage difference is usually small enough so that the gate induced source leakage (GISL) can be ignored. In GIDL, a leakage current is established between the drain and bulk (body) of the FET, while in GISL the leakage is between the source and bulk. The GIDL depends mainly on oxide thickness and gate to drain voltage difference. With lower voltage differences the GIDL becomes very small and can be ignored.

Although the present invention is not limited to any particular application, an area where it is useful is in the field of dynamic read only memories (DRAMs). Thus, high gate to drain voltages are found, for example, in the row path of DRAMs where voltage boosted above the normal supply voltage and negative voltages are used together in the same circuit.

SUMMARY OF THE INVENTION

In accordance with the present invention, an electrical circuit is provided which comprises a first metal oxide silicon (MOS) n type field effect transistor (NFET) or p type field effect transistor (PFET) and a second MOS NFET or PFET of the same conductivity type as the first NFET or PFET, wherein the drain of the first NFET or PFET is directly connected to the source of the second NFET or PFET and wherein the gate of the second NFET or PFET is at a voltage value which is equal to or lower than the drain voltage value of the second NFET or PFET in the case of an NFET, and equal to or higher than the drain voltage value of the second NFET or PFET in the case of a PFET.

BRIEF DESCRIPTION OF THE DRAWINGS

The invention will be better understood by referring to the accompanying drawings wherein.

DETAILED DESCRIPTION

Figure 1:
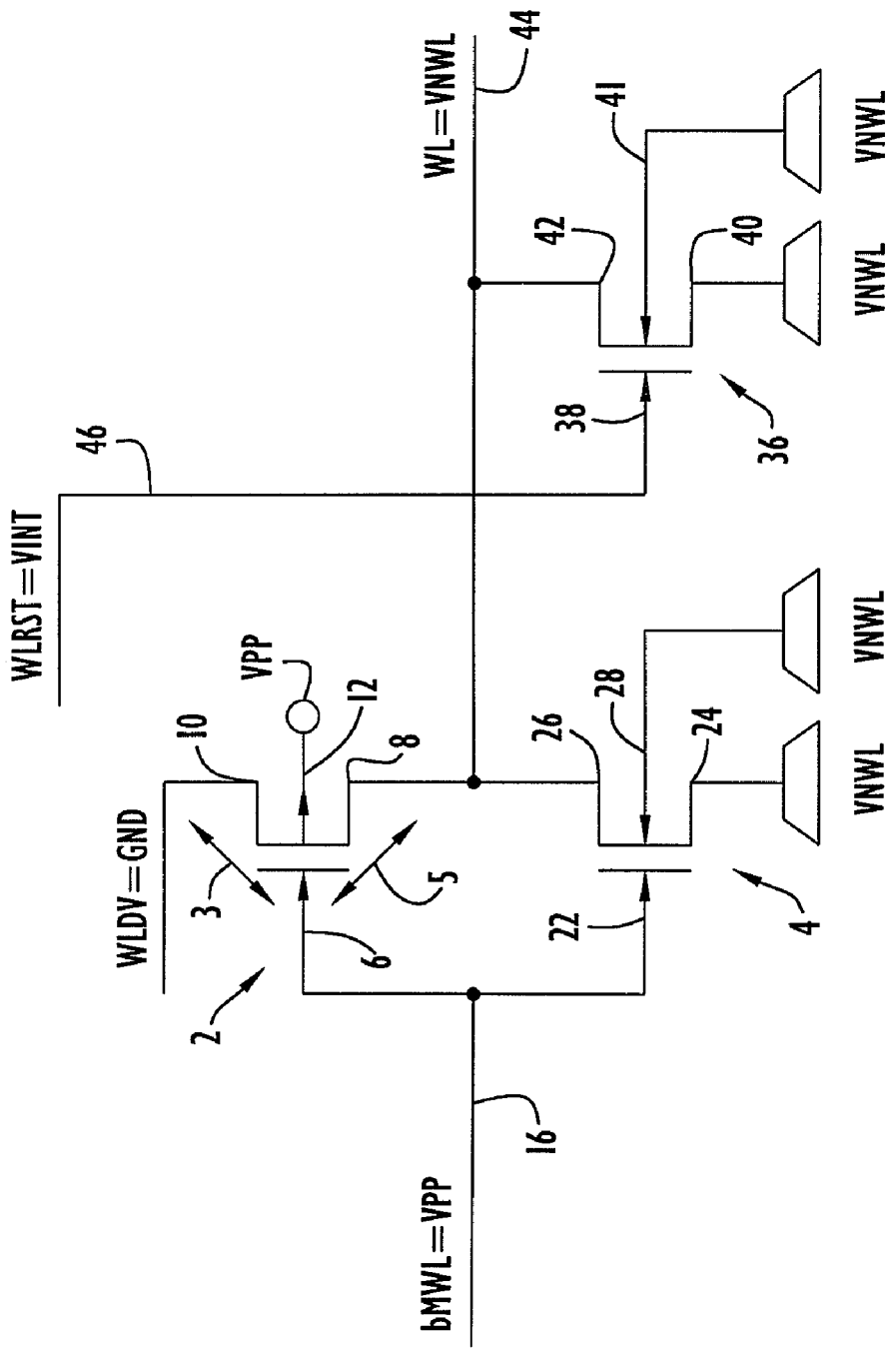
FIG. 1 is a representative schematic diagram of a prior art wordline driver for a DRAM memory.
Figure 2:
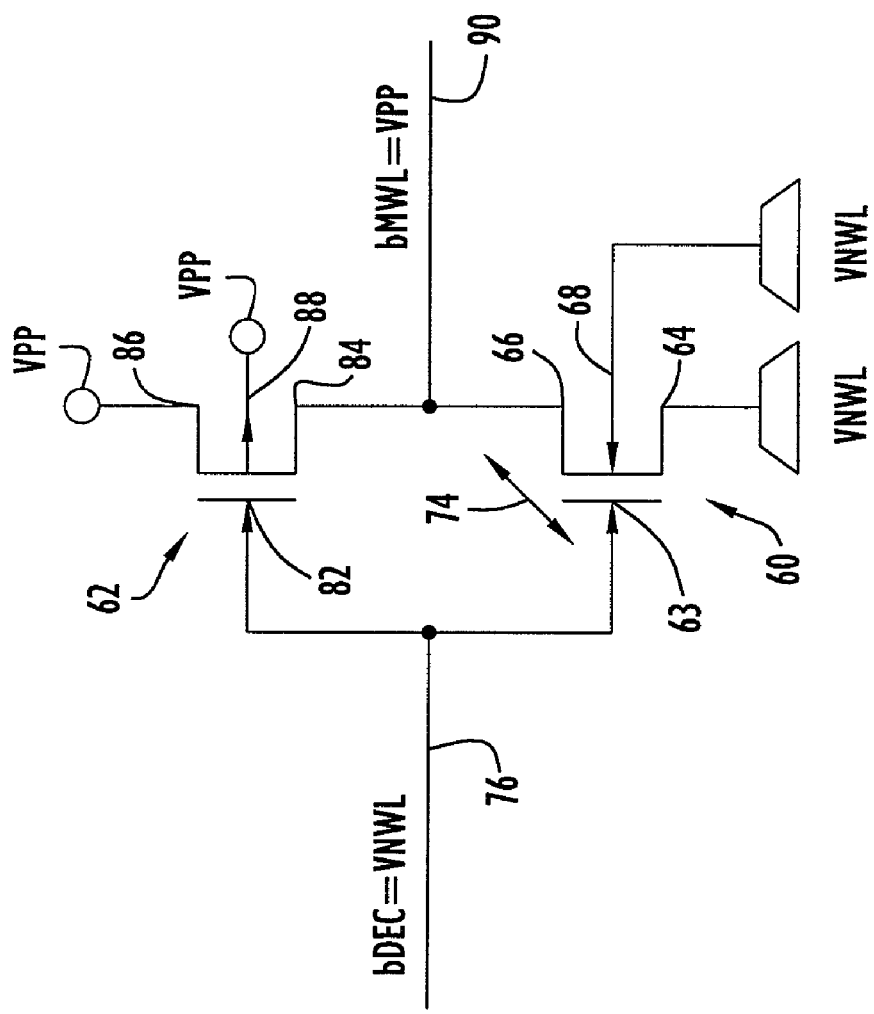
FIG. 2 is a representative schematic diagram of a prior art master wordline driver for a DRAM memory.

FIG. 1 depicts a prior art wordline driver for a DRAM while FIG. 2 depicts a prior art master wordline driver for a DRAM. For clarity of illustration, the invention is described in connection with a particular application, a wordline driver for a DRAM, but it should be understood that the invention is broadly applicable to any application involving FET circuitry.

In memory arrays it may be desirable to access an entire row (or column) at once rather than each memory cell individually. Due to gate capacitance and wire load restrictions a whole row (or column) of cells cannot be driven by one wordline driver, instead a segmented approach is chosen. Referring again to FIGS. 1 and 2, a master wordline driver, such as is shown in FIG. 2 is used in the accessing of the segmented wordline driver of FIG. 1 which is used in accessing individual words which comprise the row.

Referring to FIG. 1, the circuit depicted is an inverting complementary MOSFET (CMOS) wordline driver. As will be discussed below, in the circuit with voltages applied as shown NFET 4 is switched on, while PFET 2 is in the off state. From a leakage point of view, the PFET is the more important FET in FIG. 1 because it carries no main device current, meaning that the leakage currents are dominant. In FIG. 1, diagonal arrow 5 represents the GIDL flowing between the bulk 12 and drain 8 while diagonal arrow 3 represents the GISL flowing between the bulk and source 10. As previously mentioned, the voltage difference between the gate and source is normally small, so the GISL is not of concern.

The input to the gates of the NFET and PFET of FIG. 1 on line 16 is bMWL, or the master wordline voltage, outputted by the master wordline driver of FIG. 2. In the embodiment shown, this voltage is at value VPP, which is a value which is boosted above the value of the normal external supply voltage VDD. Source 24 and bulk 28 of NFET 4 are fed with voltage VNWL, which is normally a negative value. Bulk 12 of PFET 2 is fed with voltage at value VPP, while the source 10 of the PFET is fed with voltage WLDV, which in the embodiment shown is at ground potential.

Because the gate voltage VPP of the NFET 4 is positive relative to the source voltage of the NFET and because the same voltage VPP is applied to the gate of the PFET 2 and is positive relative to the source of the PFET, the NFET is switched on, while the PFET is switched off. Thus, the output voltage WL of the inverter on line 44 becomes VNWL. NFET 36 is a holding FET, and when the input to gate 38 WLRST on line 46 becomes a positive voltage VINT NFET 36 is switched on, and ensures that the voltage VNWL applied at source 40 and bulk 41 continue to be present at drain 42 even if the CMOS FET pair 4, 2 should change switching states.

Figure 3:
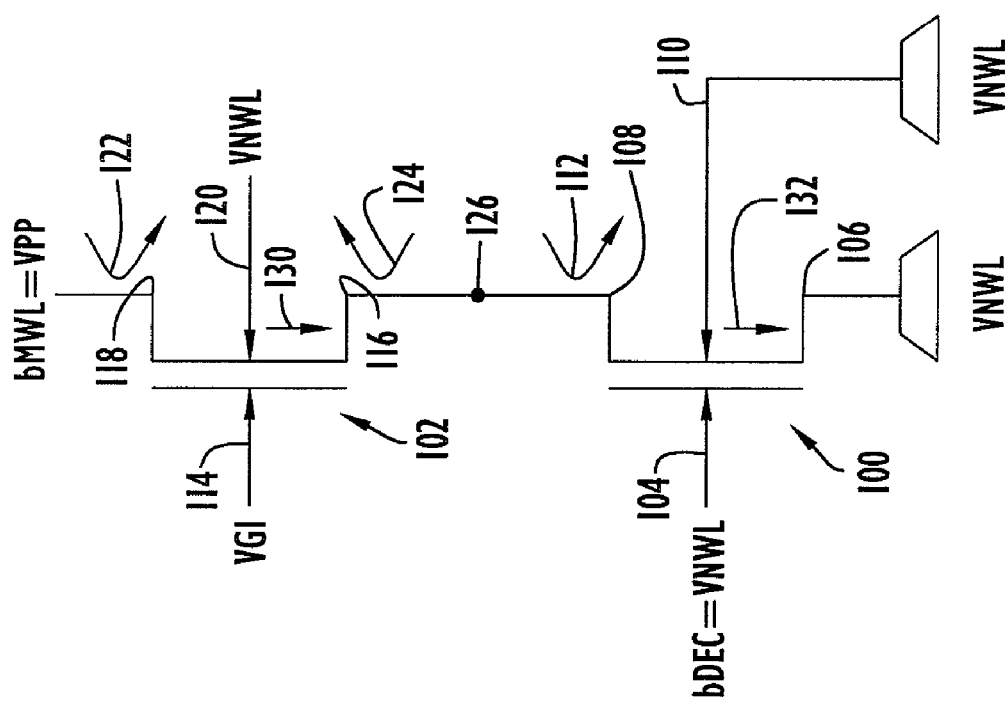
FIG. 3 is a schematic diagram which illustrates an embodiment of the invention.

Referring next to the master wordline driver circuit of FIG. 2, it will be seen that while the circuit itself is the same as that of FIG. 1 except for the absence of the holding FET 36, the input voltages applied to the FETs are different. Thus, the gates 62 and 82 of NFET 60 and PFET 62 respectively are inputted with the bDEC voltage on line 76, which is VNWL. The source 86 and bulk 88 of the PFET are fed with a voltage at boosted level VPP, while the source 64 and bulk 68 of the NFET are fed with voltage VNWL as in FIG. 1. It will be noted that the drain 84 of the PFET and the drain 66 of the NFET are directly connected together as in FIG. 1. In this embodiment, the negative voltage VNWL applied to the gates of both FETs switches the PFET on and the NFET off. Thus, the source voltage VPP of the PFET appears at the bMWL output on line 90 at the junction where the drains of the respective devices are connected. Since the NFET is off, it is the GIDL of this device which is significant in FIG. 2, as denoted by the diagonal line 74. As in the case of FIG. 1, the maximum voltage difference applies between VPP and VNWL, and in order to suppress the GIDL this voltage difference must be lowered from its normal value. FIG. 3 depicts an embodiment of the invention which accomplishes this.

Referring to FIG. 3, it will be seen that the circuit is comprised of NFET 100 and NFET 102, with the drain 108 of NFET 100 being directly connected to the source 116 of NFET 102. The circuit of FIG. 3 replaces NFET 60 in the circuit of FIG. 2. The gate, source, and body of NFET 100 are fed with the same voltages as NFET 60 in FIG. 2. Thus, the bDEC input at value VNWL is inputted to gate 104, and this same voltage value is inputted to both the source 106 and body 110 of NFET 100. The purpose of NFET 102 is to keep the voltage at node 126 which is at the drain/source junction of NFETs 100 and 102 at a value which renders the gate to drain voltage difference of NFET 100 small enough to suppress the GIDL 112 of NFET 100.

This is accomplished by controlling the voltage VG1 on gate 114 of NFET 102 to be equal to or lower than the voltage on drain 118 of NFET 102. The bMWL voltage, at value VPP is applied to drain 118 of NFET 102 while the voltage VNWL is applied to body 120. It should be understood that the applied voltages of FIG. 3 are for the case illustrated in FIG. 2, where the NFET is switched off.

In FIG. 3, the GIDL current 122 and GISL current 124 of NFET 102 are depicted by the curved arrows. These currents flow respectively from drain to body and from source to body. There is also a main leakage current (subthreshold current) denoted by the vertical arrow 130 which flows from drain to source of NFET 102. The NFET 100 also has a main leakage current which flows from the drain to source of NFET 100 denoted by vertical arrow 132. The amount of subthreshold current is defined by device dimensions (gate width and length) and voltage difference between gate and source. Since the NFETs are in series, the leakage currents in both devices equalize and cause the voltage at node 126 to be drawn down and adjust to a gate to source voltage difference on device 102 which supports the equalized current. As a result the voltage of node 126 adjusts to a value less than VG1, or in the worst case equal to VG1. The voltage VG1 has been selected such that the voltage value at node 126 is low enough value to suppress the GIDL 112 of NFET 100.

Representative voltages which may be applied to and which may occur in the circuit of FIG. 3 are listed below. VG1, VD1, VS1 and VB1 refer to voltages at the gate, drain, source, and body of FET 102, while VG2, VD2, VS2 and VB2 refer to voltages at the corresponding electrodes of FET 100.

Target Operation: VS1, VD2=1.4V
    VD1=2.6V, VG1=1.8V, VS1=1.4V, VB1=−0.6V
    VD2=1.4V, VG2=−0.6V, VS2=−0.6V, VB2=−0.6V Worst Case Operation: VS1, VD2=1.8V
    VD1=2.6V, VG1=1.8V, VS1=1.8V, VB1=−0.6V
    VD2=1.8V, VG2=−0.6V, VS2=−0.6V, VB2=−0.6V GIDL D1:
VD1G1=2.6−1.8=0.8V; VB1=−0.6V→no GIDL current since VDG very small.

GISL S1:
VS1G1=−0.4 (worst case)→no GISL current since VSG very small!

GIDL D2:
VD2G2=1.4V−(−0.6V)=2.0V compared to 3.2V in the original configuration of FIG. 2→no significant GIDL current added anymore.

It should be understood that the specific voltages mentioned above are for purposes of illustration only, and the invention is not limited to such values or to the case illustrated where the gate input is at a boosted voltage and the drain is at a negative voltage.

Figure 4:
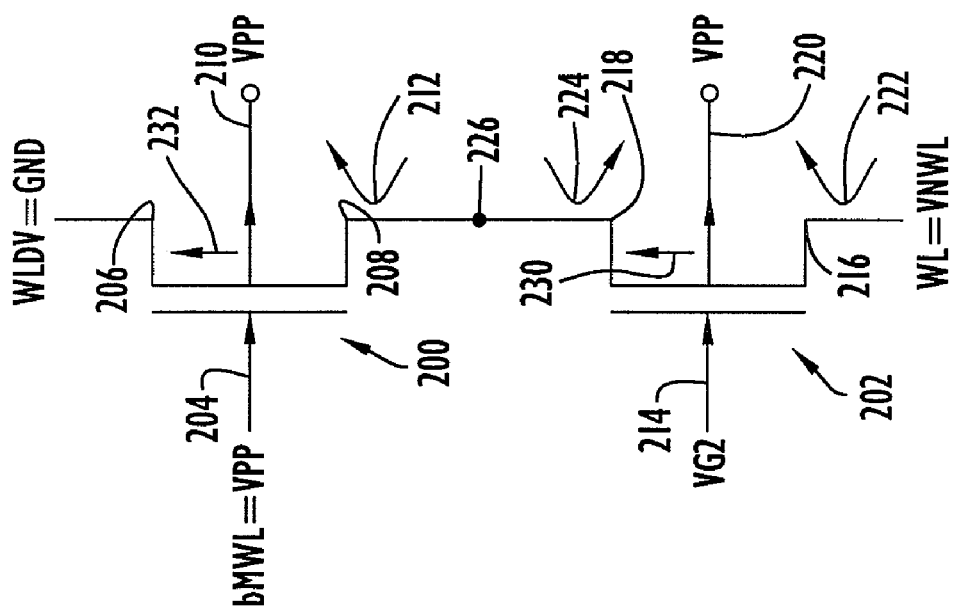
FIG. 4 shows a further embodiment of the invention.

FIG. 4 shows a circuit similar to that of FIG. 3, except for the case where the the PFET is switched off, as in FIG. 1. The circuit is comprised of PFET 200, which is switched off because of boosted voltage VPP applied to it's gate 204 and the WLDV voltage at ground potential applied to it's source 206. An additional PFET 202 is provided, and the source 218 of PFET 218 is connected to drain 208 of PFET 200. Node 226 is present at the junction of source 218 and drain 208. Voltage at level VPP is applied to bulk 210 of PFET 200 and bulk 220 of PFET 202, while negative voltage VNWL is present at drain 216 of PFET 202.

The purpose of PFET 202 is to keep the voltage at node 226 at a value which renders the gate to drain voltage difference of PFET 200 small enough to suppress the GIDL 212 of PFET 200. This is accomplished by controlling the voltage VG2 on gate 214 of PFET to be equal to or higher than the voltage on drain 216 of PFET 202.

GIDL current 222 and GISL current 224 of PFET 202 are also depicted in FIG. 4. There is also main leakage current (subthreshold current) 232 of PFET 200 and main leakage current 230 of PFET 202. In the operation of the circuit, since the PFET's are in series, the leakage currents in both devices equalize and cause the voltage at node 226 to adjust to a gate to source voltage difference on device 202 which supports the equalized current. Such voltage at node 226 is effective to suppress the GIDL 212 of PFET 200.

In the specific example given for FIG. 3, a D.C. voltage of 1.8 volts was assumed for VG1. If this voltage is lowered too much the reduced current drive may cause the switching speed of the inverter logic to be adversely affected, so it is desirable to find a balance between speed and current reduction. In this regard, the gate voltage of NFET 102 in FIG. 3 can be alternated between a relatively low value for power consumption relevant conditions and a relatively high voltage for speed relevant conditions. For example, if a mobile device is in standby mode and it is desired to preserve battery life, the voltage value for VG1 can be at a relatively low value, while if the device is in the operating mode and speed is more important, the voltage can be switched to a higher value.

Figure 5:
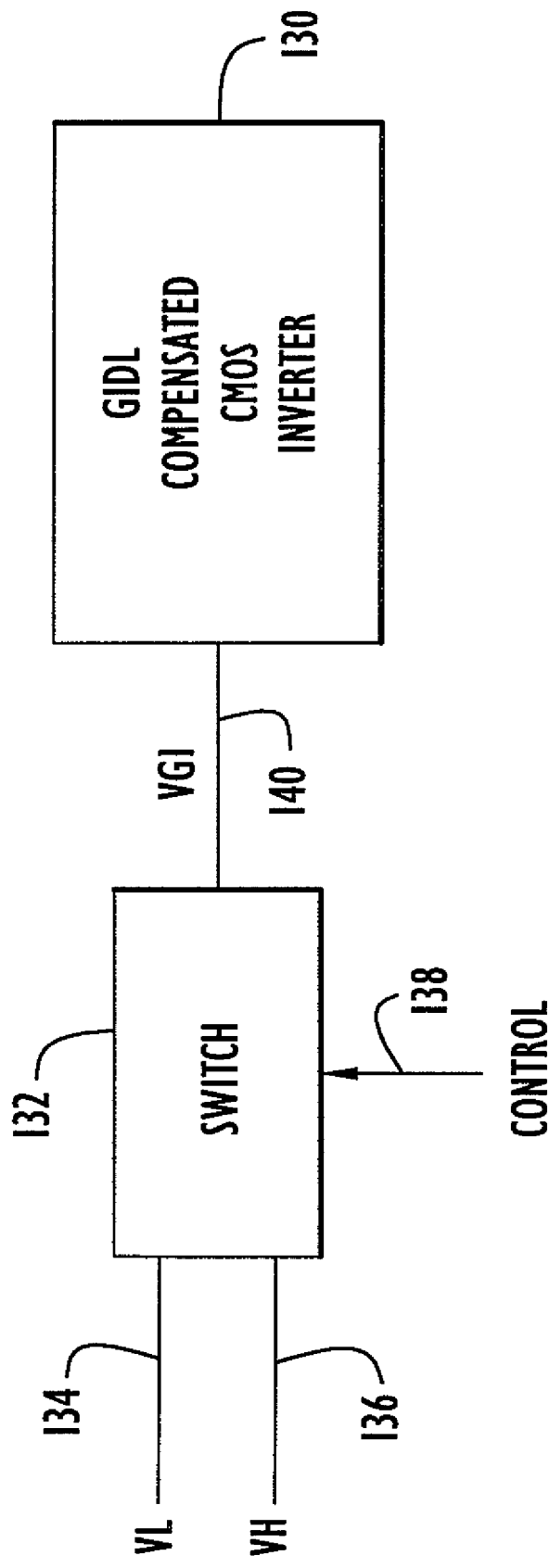
FIG. 5 shows a still further embodiment of the invention.

Referring to FIG. 5, an embodiment is shown for alternating the gate voltage value VG1 as described in the preceding paragraph. It is desired in this embodiment to alternate the value of voltage G1 on line 140, which is inputted to GIDL compensated CMOS inverter 130, such as is described above.

Switch 132 is provided which has input conductors 134 and 138 connected thereto. Input conductor 134 is fed with relatively low voltage VL while input conductor 138 is fed with relatively high voltage VH. A signal on control conductor 138 determines whether the switch feeds output VL or VH to output conductor 140. The control signal on conductor 138 is arranged so that the switch outputs the low voltage VL for power consumption relevant conditions and the high voltage VH for speed relevant conditions. A similar system can be used for controlling the voltage VG2 in FIG. 4.

There thus has been disclosed circuitry, apparatus and methods for use with FETs. In accordance with a further aspect of the invention a method of making an electrical circuit is provided which comprises a method of making an electrical circuit comprising providing a first n type field effect transistor (NFET) or p type field effect (PFET), providing a second NFET or PFET of the same conductivity type as the first NFET or PFET, electrically connecting the drain of the first NFET or PFET with the source of the second NFET or PFET, providing a third NFET or PFET of opposite conductivity type as the first NFET or PFET, and electrically connecting the drain of the third NFET or PFET with the drain of the second NFET or PFET.

It should be understood that while the invention has been described in detail and with reference to specific embodiments thereof, it will be apparent to one skilled in the art that various changes and modifications can be made therein without departing from the spirit and scope thereof. Accordingly, it is intended that such modifications and variations of the invention be covered provided they come within the scope of the appended claims and their equivalents.

What is claimed is:

1. A method of operating an electrical circuit comprised of a first metal oxide silicon (MOS) n type field effect transistor (NFET) or p type field effect transistor (PFET) and a second MOS NFET or PFET of the same conductivity type as the first NFET or PFET, wherein the drain of the first NFET or PFET is directly connected to the source of the second NFET or PFET, comprising:

supplying the gate and source of the first NFET or PFET with respective voltages such that the first NFET or PFET is switched off; and controlling the gate voltage of the second NFET or PFET to be at a level which results in a main leakage current in the first NFET or PFET which causes the drain voltage of the first NFET or PFET to be at a value in relation to a value of a supplied voltage to the gate of the first NFET or PFET, which suppresses GIDL in the first NFET or PFET.

2. The method of claim 1 wherein the gate voltage of the second NFET or PFET is controlled to be equal to or lower than the drain voltage of the second NFET or PFET in the case of an NFET or equal to or higher than the drain voltage of the second NFET or PELT in the case of a PFET.

3. The method of claim 2 wherein in said circuit the junction of the drain of the first NFET or PFET and the source of the second NFET or PFET is not connected to any voltage.

4. The method of claim 3 wherein said electrical circuit is connected with a further FET in an inverter arrangement, further comprising controlling the further FET to be in the on state.

5. The method of claim 4 further comprising alternating the gate voltage of the second NFET or PFET between a level which results in suppression of GIDL in the first NFET or PFET and a level which does not result in said suppression.

6. An electrical circuit comprising a first metal oxide silicon (MOS) n type field effect transistor (NFET) or p type field effect transistor (PFET) and a second MOS NFET or PFET of the same conductivity type as the first NFET or PFET, wherein the drain of the first NFET or PFET is directly connected to the source of the second NFET or PFET, and wherein the gate of the second NFET or PFET is alternated between a voltage value which is effective to suppress gate induced drain leakage (GIDL) in the first NFET or PFET and a value which does not suppress GIDL in the first NFET or PFET but which results in higher speed operation than the voltage value which suppresses GIDL.

* * * * *